(12) United States Patent
Sakai

(10) Patent No.: US 9,973,357 B2
(45) Date of Patent: May 15, 2018

(54) DECISION FEEDBACK EQUALIZER AND SEMICONDUCTOR INTEGRATED CIRCUIT

(71) Applicant: FUJITSU LIMITED, Kawasaki-shi, Kanagawa (JP)

(72) Inventor: Yasufumi Sakai, Fuchu (JP)

(73) Assignee: FUJITSU LIMITED, Kawasaki (JP)

(*) Notice: Subject to any disclaimer, the term of this patent is extended or adjusted under 35 U.S.C. 154(b) by 0 days. days.

(21) Appl. No.: 15/612,404

(22) Filed: Jun. 2, 2017

(65) Prior Publication Data

US 2017/0373889 A1 Dec. 28, 2017

(30) Foreign Application Priority Data

Jun. 24, 2016 (JP) .................................. 2016-125556

(51) Int. Cl.
*H04L 25/03* (2006.01)
*H03L 7/08* (2006.01)
*H03K 3/356* (2006.01)
*H03K 3/037* (2006.01)
*H03K 5/156* (2006.01)

(52) U.S. Cl.
CPC ....... *H04L 25/03057* (2013.01); *H03K 3/037* (2013.01); *H03K 3/356017* (2013.01); *H03K 5/1565* (2013.01); *H03L 7/0807* (2013.01)

(58) Field of Classification Search
CPC ............ H04L 25/03057; H03L 7/0807; H03K 5/1565; H03K 3/037; H03K 3/356017
See application file for complete search history.

(56) References Cited

U.S. PATENT DOCUMENTS

| 8,872,691 | B1* | 10/2014 | Stepanovic | ............. H03M 1/06 341/144 |
| 2005/0184780 | A1* | 8/2005 | Chun | .................. H03K 5/1565 327/175 |
| 2007/0247885 | A1* | 10/2007 | Watanabe | ............. G11C 15/04 365/49.17 |
| 2015/0019770 | A1* | 1/2015 | Chen | ................. H04L 25/03057 710/104 |
| 2016/0233867 | A1* | 8/2016 | Tamura | ................ H03K 3/0372 |

OTHER PUBLICATIONS

Palermo,"ECEN720: High-Speed Links Circuits and Systems Spring 2013", Lecture 8: RX FIR, CTLE, & DFE Equalization, Analog & Mixed-Signal Center, Texas A&M University, 2013.
Payne et al., "A 6.25-Gb/s Binary Transceiver in 0.13-μm CMOS for Serial Data Transmission Across High Loss Legacy Backplane Channels", IEEE J. Solid-State Circuits, vol. 40, No. 12, Dec. 2005, pp. 2646-2657.

* cited by examiner

*Primary Examiner* — Jean B Corrielus
(74) *Attorney, Agent, or Firm* — Staas & Halsey LLP

(57) ABSTRACT

A decision feedback equalizer includes a comparator configured to output a constant voltage in a reset period and to output a differential voltage corresponding to differential input signals in an evaluation period, a latch circuit configured to hold the differential voltage in the evaluation period, and an adjuster configured to adjust a logical threshold of the latch circuit closer to the output voltage in the reset period.

14 Claims, 19 Drawing Sheets

—Prior Art—

DECISION FEEDBACK EQUALIZER AND SEMICONDUCTOR INTEGRATED CIRCUIT

CROSS-REFERENCE TO RELATED APPLICATION

This application is based upon and claims the benefit of priority of the prior Japanese Patent Application No. 2016-125556, filed on Jun. 24, 2016, the entire contents of which are incorporated herein by reference.

FIELD

The embodiments discussed herein are related to a decision feedback equalizer and a semiconductor integrated circuit.

BACKGROUND

In recent years, components such as CPUs, which configure an information processing system such as a server or a computer, each has achieved an increase in performance, and in particular, bandwidths have been greatly improved. In order to increase the total bandwidth of the entire information processing system, communication circuits to perform data communication between components such as CPUs have to be speeded up. In a communication circuit that performs high-speed data communication, an equalizer to compensate the deterioration of a data signal, which occurs in a communication channel, is used.

As one of examples of the equalizer, there is a decision feedback equalizer (DFE) (see, for example, Sam Palermo, "ECEN720: High-Speed Links Circuits and Systems Spring 2013"). As an example illustrated in FIG. 16, the decision feedback equalizer includes an adder 1601, a comparator 1602, and a feedback filter 1603. In accordance with a determination result of the comparator 1602, the decision feedback equalizer changes a determination threshold of the comparator 1602 by an amount corresponding to the magnitude of inter symbol interference (ISI) that may occur in the communication circuit.

In the decision feedback equalizer, every time the comparator 1602 determines an input signal, the feedback filter 1603 obtains a weighted sum, based on a determination result ($d_k$) of the comparator 1602 and coefficient $W_1, \ldots, W_{n-1}$, and $W_n$ set from the outside, and the adder 1601 adds the obtained weighted sum to a reception signal $y_k$ as an offset voltage of the comparator 1602. In addition, the comparator 1602 performs determination while defining an output $z_k$ of the adder 1601 as an input signal, thereby outputting a determination result as a reception data signal. In this way, the decision feedback equalizer changes the determination threshold of the comparator by an amount of the inter symbol interference. Therefore, it becomes possible to compensate the deterioration of the data signal, caused by the inter symbol interference.

Here, in general, from a viewpoint of power consumption, a comparator that has a reset period for performing a reset operation and an evaluation period for performing a determination operation (a comparison operation) is used as the comparator used for decision feedback equalizer. In a case where the comparator used for the decision feedback equalizer performs the reset operation, a time-interleaved configuration in which comparators are parallelized is used. However, the reset operation performed by the comparator results in disappearance of a determination result output by the comparator. Therefore, in order to avoid a situation that the reset operation results in the disappearance of the determination result of the comparator, thereby causing no previous determination result to be reflected in a comparator that currently performs a determination operation, there is proposed a technology for adding, to a subsequent stage of the comparator, a latch circuit to hold a determination result (see, for example, R. Payne et al., "A 6.25-Gb/s Binary Transceiver in 0.13-um CMOS for Serial Data Transmission Across High Loss Legacy Backplane Channels", IEEE 1 Solid-State Circuits, vol. 40, no. 12, pp. 2646-2657, December 2005).

SUMMARY

According to an aspect of the invention, a decision feedback equalizer includes a comparator configured to output a constant voltage in a reset period and to output a differential voltage corresponding to differential input signals in an evaluation period, a latch circuit configured to hold the differential voltage in the evaluation period, and an adjuster configured to adjust a logical threshold of the latch circuit closer to the output voltage in the reset period.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In a decision feedback equalizer, in a case of adding a latch circuit to a subsequent stage of a comparator, a delay time of a path for feeding back a determination result turns out to increase. In addition, in the decision feedback equalizer, a determination result output by the comparator has to be fed back within a time period of one unit interval (UI). However, in a case where a data rate in communication becomes high, the time period of one UI is shortened. As a result, it is difficult for the decision feedback equalizer to deal with a higher data rate. In one aspect, an object of the present technology is to provide a decision feedback equalizer to enable high data-rate communication. Hereinafter, embodiments of the present technology will be described based on drawings.

Figure 17:
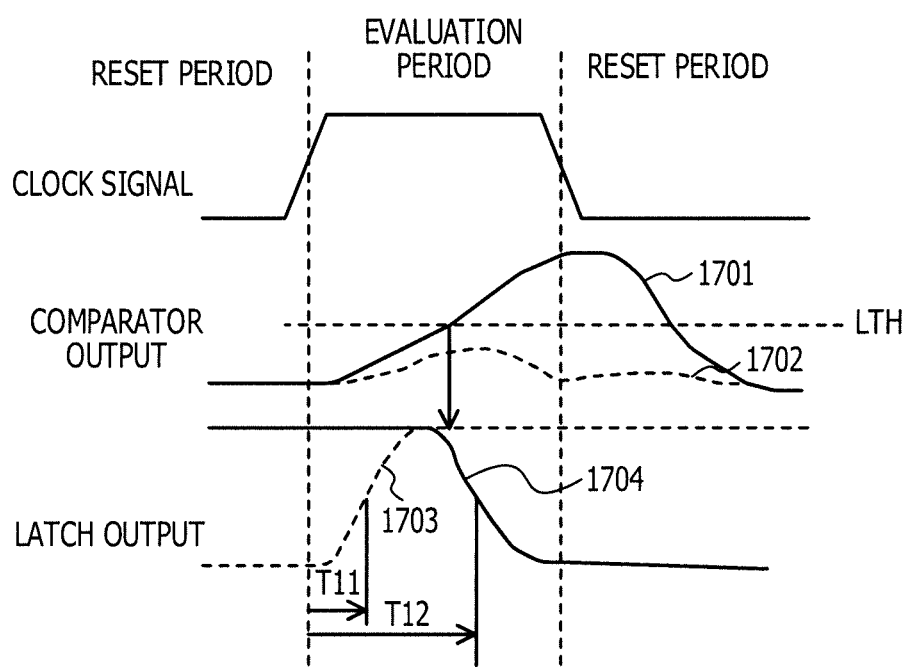
FIG. 17 is a diagram for explaining a delay time.

First, a delay time in a case where a latch circuit is added to a subsequent stage of a comparator in a decision feedback equalizer will be described with reference to FIG. 17. It is assumed that the comparator has a differential input-output configuration, two output signals of the comparator each output the same value (a low level in the present example) in a reset period for performing a reset operation, and one of the two output signals of the comparator and the other thereof are put into a high level and a low level, respectively, in response to an input signal in an evaluation period for performing a determination operation (a comparison operation). In addition, it is assumed that the latch circuit outputs a result obtained by inverting an input signal.

A time period in which a clock signal has a low level is the reset period of the comparator, and output signals 1701 and 1702 of the comparator each have the low level. In addition, at this time, the latch circuit holds an output of the comparator in a previous evaluation period and the output signal 1703 serving as one of the output signals of the latch circuit and the output signal 1704 serving as the other thereof have a low level and a high level, respectively. In a case where the clock signal changes from the low level to a high level and enters the evaluation period of the comparator, the output signal 1701 serving as one of the output signals of the comparator and the output signal 1702 serving as the other thereof are put into the high level and the low level, respectively. At this time, in the latch circuit, upon receiving the output signal 1702 serving as the other of the output signals of the comparator, the output signal 1703 serving as one of the output signals of the latch circuit is put into the high level, and upon receiving the output signal 1701 serving as one of the output signals of the comparator, the output signal 1704 serving as the other thereof is put into the low level.

Here, in the latch circuit, a logical threshold LTH for determining whether an input signal has the high level or has the low level exists. In a case where an output signal of the latch circuit is put into the high level in the evaluation period, an output signal of the comparator remains at the low level even if a transition from the reset period to the evaluation period is made. In other words, since there is no delay time before the output signal of the comparator reaches the logical threshold of the latch circuit, the output signal of the latch circuit is swiftly put into the high level after a short time period T11 subsequent to a transition to the evaluation period. On the other hand, in a case where the output signal of the latch circuit is put into the high level in the evaluation period, there is a delay time before the input signal of the latch circuit, in other words, the output signal of the comparator reaches the logical threshold of the latch circuit from the low level. As a result, compared with a case where the output signal of the latch circuit is put into the low level, the output signal of the latch circuit is put into the high level after a long time period T12 subsequent to a transition to the evaluation period.

The delay time of the entire latch circuit is determined by a time period before both the two output signals of the latch circuit are settled. Therefore, in the example illustrated in FIG. 17, the time period T12 before the output signal of the latch circuit is put into the high level is a main factor in determining the delay time of the entire latch circuit. Accordingly, in a case where, in the reset period, the input signal of the latch circuit, in other words, the output signal of the comparator has the low level, the logical threshold of the latch circuit is decreased, thereby shortening a time period before the output signal of the comparator reaches the logical threshold of the latch circuit, and accordingly, it is possible to reduce the delay time of the entire latch circuit. In other words, by controlling the logical threshold of the latch circuit so as to put the logical threshold of the latch circuit closer to the input signal of the latch circuit in the reset period, in other words, the value of the output signal of the comparator, it is possible to reduce the delay time of the entire latch circuit.

Figure 18:
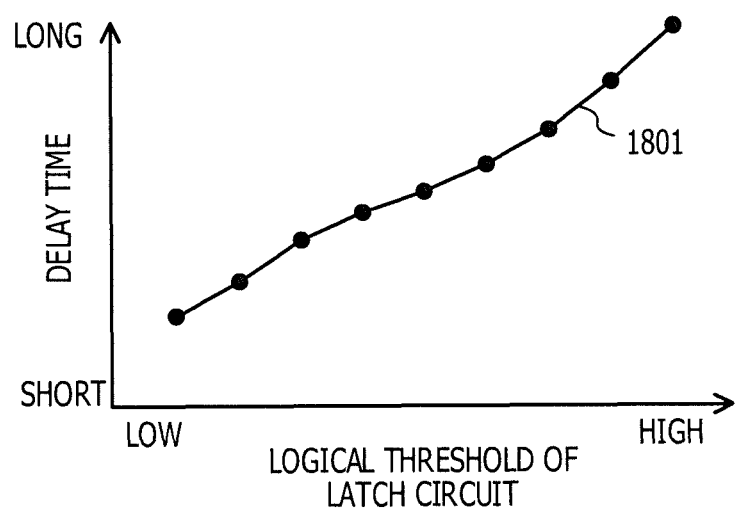
FIG. 18 is a diagram illustrating a change in a delay time, which corresponds to a logical threshold of the latch circuit.

Therefore, in the embodiments described below, in the decision feedback equalizer, the logical threshold of the latch circuit added to a subsequent stage of the comparator is put closer to the value of the output signal of the comparator in the reset period, and accordingly, a delay time of a path for feeding back a determination result is shortened. As illustrated by, for example, a solid line 1801 in FIG. 18, by decreasing the logical threshold of the latch circuit of the decision feedback equalizer, it is possible to shorten the delay time of the path for feeding back a determination result, and accordingly, it becomes possible to perform high data-rate communication.

First Embodiment

Figure 1:
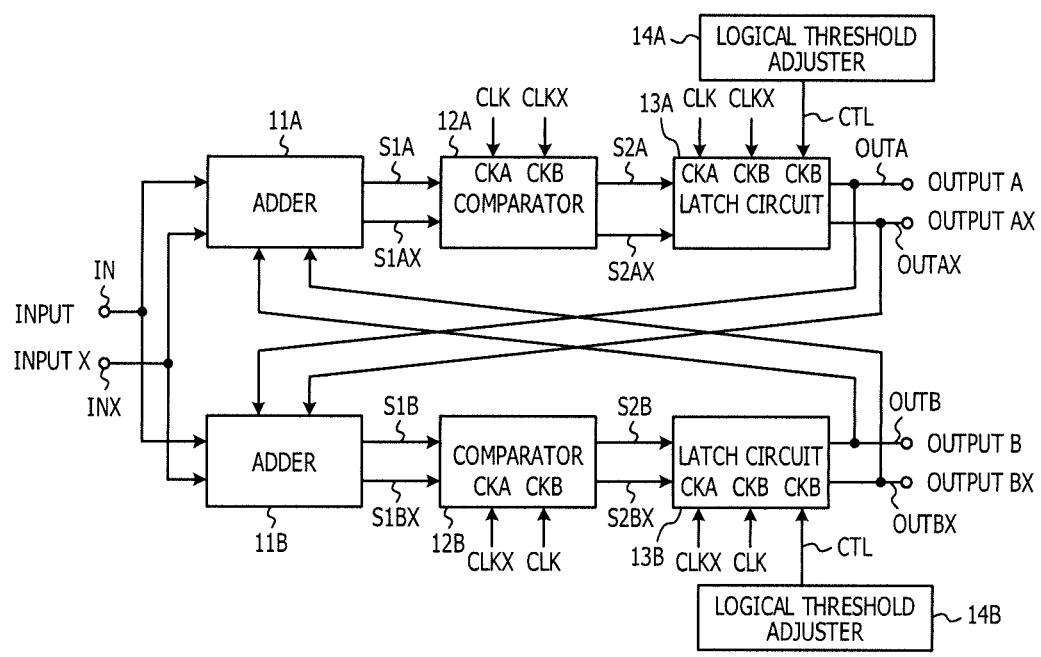
FIG. 1 is a diagram illustrating an example of a configuration of a decision feedback equalizer in a first embodiment.

Hereinafter, a first embodiment of the present technology will be described. FIG. 1 is a diagram illustrating an example of a configuration of a decision feedback equalizer (DFE) in the first embodiment. FIG. 1 illustrates a decision feedback equalizer which has a two-parallel time-interleaved configuration, in other words, a half-rate configuration and which includes adders 11A and 11B, comparators 12A and 12B, latch circuits 13A and 13B, and logical threshold adjusters 14A and 14B. Note that, in the following description, a signal described as a "signal nameX" is a signal obtained by inverting a signal having a "signal name" (the same applies to other examples).

The adder 11A adds, to differential input signals IN and INX, offset voltages based on output signals OUTB and OUTBX of the latch circuit 13B and outputs results thereof as output signals S1A and S1AX. In the same way, the adder 11B adds, to the differential input signals IN and INX, offset voltages based on output signals OUTA and OUTAX of the latch circuit 13A and outputs results thereof as output signals S1B and S1BX.

Each of the comparators 12A and 12B is a comparator that operates in synchronization with input clock signals and that has a differential input-output configuration. In addition, each of the comparators 12A and 12B performs a reset operation and a determination operation (a comparison operation) in a reset period and an evaluation period, respectively, in response to the input clock signals. Each of the comparators 12A and 126 is put into the reset period in a case of the low level of a clock signal CKA and is put into the evaluation period in a case of the high level of the clock signal CKA.

In the example illustrated in FIG. 1, the comparator 12A performs the reset operation in a case of the low level of a clock signal CLK input as the clock signal CKA and outputs output signals S2A and S2AX each having a low level. In addition, the comparator 12A performs the determination operation (the comparison operation) related to the output signals S1A and S1AX of the adder 11A in a case of the high level of the clock signal CLK input as the clock signal CKA and outputs the output signals S2A and S2AX, one of which is put into a high level in accordance with a determination result and the other of which is put into the low level in accordance therewith.

In the same way, the comparator 12B performs the reset operation in a case of the low level of a clock signal CLKX input as the clock signal CKA and outputs output signals S2B and S2BX each having a low level. In addition, the comparator 12B performs the determination operation (the comparison operation) related to the output signals S1B and S1BX of the adder 11B in a case of the high level of the clock signal CLKX input as the clock signal CKA and outputs the output signals S2B and S2BX, one of which is put into a high level in accordance with a determination result and the other of which is put into the low level in accordance therewith.

The latch circuits 13A and 13B each operate in synchronization with input clock signals. In a case where the clock signal CKA has the high level, the latch circuits 13A and 13B invert and output the output signals of the corresponding comparators 12A and 12B, respectively, and in a case where the clock signal CKA has the low level, the latch circuits 13A and 13B hold, invert, and output the output signals of the comparators 12A and 12B, respectively, at a time of a transition of the clock signal CKA from the high level to the low level. In addition, in the latch circuits 13A and 136, in accordance with control signals CTL that are input as control signals THC and that are output by the logical threshold adjusters 14A and 14B, respectively, logical thresholds, each of which is used for determining whether an input signal has a high level or has a low level, are controlled.

In other words, in a case where a connected comparator is in the evaluation period, each of the latch circuits 13A and 13B fetches, inverts, and outputs the output signal of the relevant comparator. In addition, in a case where a connected comparator is in the reset period, each of the latch circuits 13A and 13B inverts and outputs, regardless of an output signal of the relevant comparator, an output signal of the relevant comparator, fetched in a previous evaluation period.

In the example illustrated in FIG. 1, in a case where the clock signal CLK input as the clock signal CKA has the high level, the latch circuit 13A inverts and outputs the output signals S2A and S2AX of the comparator 12A as the output signals OUTA and OUTAX. In addition, in a case where the clock signal CLK input as the clock signal CKA has the low level, the latch circuit 13A inverts and outputs the output signals S2A and S2AX of the comparator 12A at a time of a transition thereof from the high level to the low level, as the output signals OUTA and OUTAX.

In the same way, in a case where the clock signal CLKX input as the clock signal CKA has the high level, the latch circuit 13B inverts and outputs the output signals S2B and S2BX of the comparator 12B as the output signals OUTB and OUTBX. In addition, in a case where the clock signal CLKX input as the clock signal CKA has the low level, the latch circuit 13B inverts and outputs the output signals S2B and S2BX of the comparator 12B at a time of a transition thereof from the high level to the low level, as the output signals OUTB and OUTBX.

The logical threshold adjusters 14A and 14B output, to the corresponding latch circuits 13A and 13B, respectively, the control signals CTL for controlling the respective logical thresholds thereof. A test for obtaining a relationship between the corresponding logical threshold and a delay time may be preliminarily performed, for example, and in accordance with the result thereof, the control signal CTL output by each of the logical threshold adjusters 14A and 14B may be set so as to obtain a desired delay time.

In the decision feedback equalizer illustrated in FIG. 1, in a case where the clock signal CLK has the high level (the clock signal CLKX has the low level), the comparator 12A is put into the evaluation period and the comparator 12B is put into the reset period. In addition, in a case where the clock signal CLKX has the high level (the clock signal CLK has the low level), the comparator 12B is put into the evaluation period, and the comparator 12A is put into the reset period.

Accordingly, in the decision feedback equalizer illustrated in FIG. 1, in a case where the clock signal CLK has the high level (the clock signal CLKX has the low level), the adder 11A, the comparator 12A, and the latch circuit 13A perform a determination operation (a comparison operation) related to the input signals IN and INX, and determination results are output as the output signals OUTA and OUTAX. In addition, in a case where the clock signal CLK has the low level (the clock signal CLKX has the high level), the adder 11B, the comparator 12B, and the latch circuit 13B perform a determination operation (a comparison operation) related to the input signals IN and INX, and determination results are output as the output signals OUTB and OUTBX.

Figure 2A:
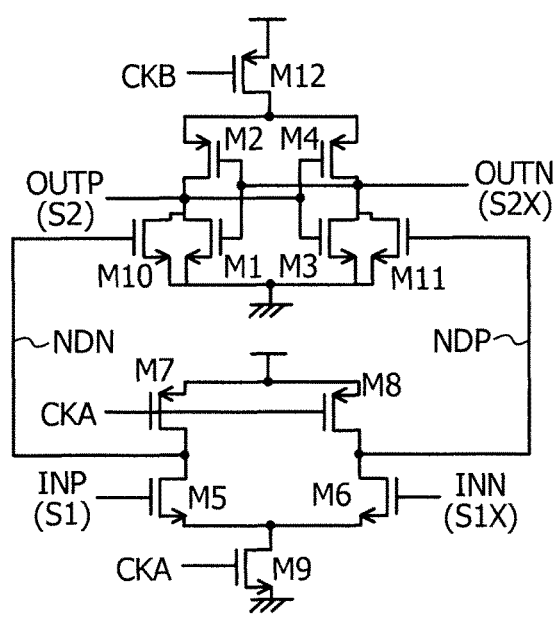
FIGS. 2A and 2B are diagrams illustrating an example of a configuration of a comparator in the first embodiment.

FIG. 2A is a diagram illustrating an example of configurations of the comparators 12 in the first embodiment. As illustrated in, for example, FIG. 2A, each of the comparators 12 is a double-tail latch-type comparator including N-channel transistors M1, M3, M5, M6, M9, M10, and M11, and P-channel transistors M2, M4, M7, M8, and M12.

Figure 2B:
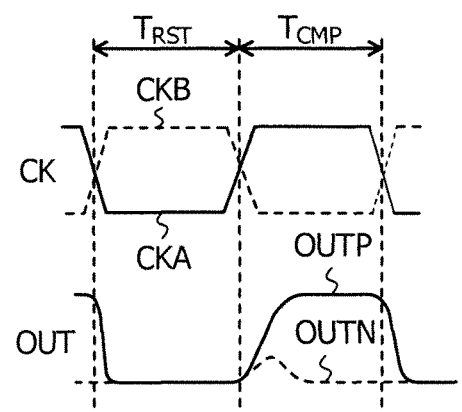

In a reset period $T_{RST}$ in which the clock signal CKA has the low level (a clock signal CKB has a high level), the transistors M7 and M8 are put into respective on-states (respective conduction states), and the transistors M9 and M12 are put into respective off-states (respective non-conduction states). For this reason, nodes NDN and NDP are put into respective high levels, and as illustrated in FIG. 2B, both output signals OUTP and OUTN are put into respective low levels.

In addition, in an evaluation period $T_{CMP}$ in which the clock signal CKA has the high level (the clock signal CKB has the low level), the transistors M9 and M12 are put into the respective on-states (the respective conduction states), and the transistors M7 and M8 are put into the respective off-states (the respective non-conduction states). For this reason, in accordance with input signals INP and INN input to the transistors M5 and M6, respectively, the potentials of the nodes NDN and NDP begin falling, one of output signals, which corresponds to a node the potential of which reaches a bottom thereof first, is put into the low level, and a latch is set by a latch circuit configured by the transistors M1 to M4, thereby putting the other of the output signals into the high level. In a case where the potential of the input signal INP is higher than the potential of the input signal INN, the output OUTP is put into the high level and the output signal OUTN is put into the low level, as illustrated in FIG. 2B, for example.

Hereinafter, configurations of the latch circuits 13 in the first embodiment will be described with reference to various examples.

First Example of Configuration

Figure 3:
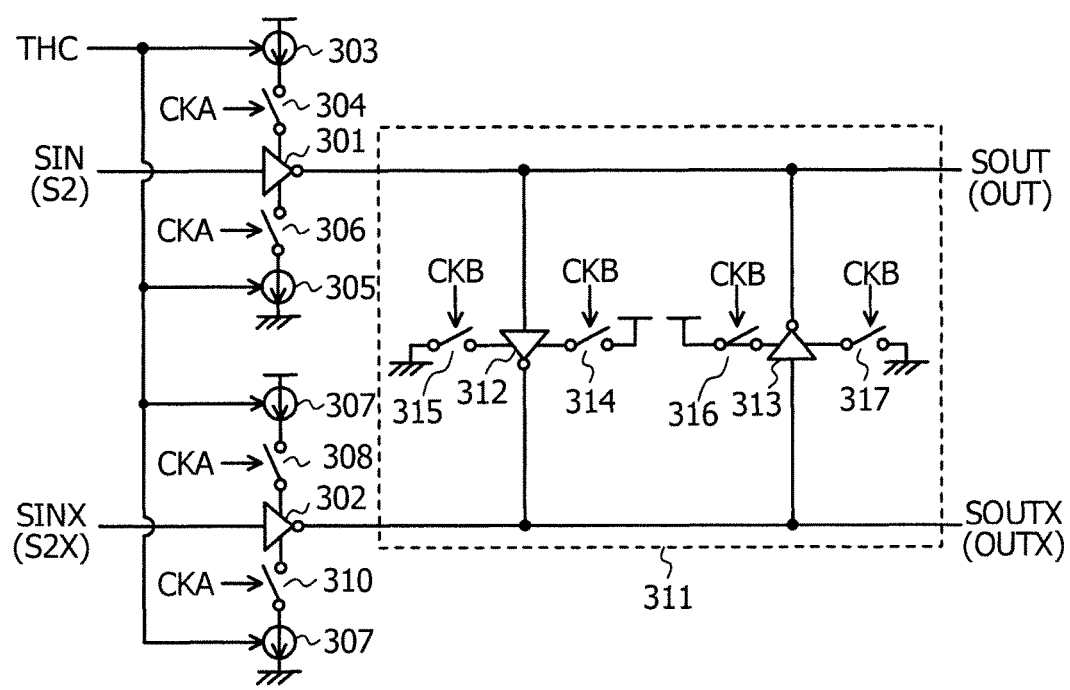
FIG. 3 is a diagram illustrating a first example of a configuration of a latch circuit in the first embodiment.

FIG. 3 is a diagram illustrating a first example of the configurations of the latch circuits 13 in the first embodiment. The latch circuit 13 illustrated in FIG. 3 includes an inverter 301 to which an input signal SIN (corresponding to the output signal S2 of the corresponding comparator 12) is input, an inverter 302 to which an input signal SINX (corresponding to the output signal S2X of the corresponding comparator 12) is input, and a holding circuit 311.

The inverter 301 is connected, via a switch 304, to a current source 303 connected to a power supply potential and is connected, via a switch 306, to a current source 305 connected to a reference potential. The switches 304 and 306 are controlled by the clock signal CKA, are put into respective on-states (respective closed states) in a case of the high level of the clock signal CKA, and are put into respective off-states (respective open states) in a case of the low level of the clock signal CKA. In a case where the clock signal CKA has the high level, the inverter 301 inverts and outputs the input signal SIN as an output signal SOUT (corresponding to the output signal OUT of the corresponding latch circuit 13).

The inverter 302 is connected, via a switch 308, to a current source 307 connected to the power supply potential and is connected, via a switch 310, to a current source 309 connected to the reference potential. The switches 308 and 310 are controlled by the clock signal CKA, are put into respective on-states (respective closed states) in a case of the high level of the clock signal CKA, and are put into respective off-states (respective open states) in a case of the low level of the clock signal CKA. In a case where the clock signal CKA has the high level, the second inverter 302 inverts and outputs the input signal SINX as an output signal SOUTX (corresponding to the output signal OUTX of the corresponding latch circuit 13).

The holding circuit 311 includes an inverter 312, an input of which is connected to a signal line of the output signal SOUT (the output of the inverter 301), and an inverter 313, an input of which is connected to a signal line of the output signal SOUTX (the output of the inverter 302). An output of the inverter 312 is connected to the input of the inverter 313, an output of the inverter 313 is connected to the input of the inverter 312, and the inverters 312 and 313 configure a latch.

The inverter 312 is connected to the power supply potential via a switch 314 and is connected to the reference potential via a switch 315. In addition, the inverter 313 is connected to the power supply potential via a switch 316 and is connected to the reference potential via a switch 317. The switches 314, 315, 316, and 317 are controlled by the clock signal CKB, are put into respective on-states (respective closed states) in a case of the high level of the clock signal CKB, and are put into respective off-states (respective open states) in a case of the low level of the clock signal CKB. Accordingly, in a case where the clock signal CKB has the high level, the holding circuit 311 holds and outputs the output signals SOUT and SOUTX by using the inverters 312 and 313.

In a case where the clock signal CKA has the high level, the latch circuit 13 illustrated in FIG. 3 inverts and outputs the input signals SIN and SINX as the output signals SOUT and SOUTX, respectively. In addition, in a case where the clock signal CKB has the high level, the output signals SOUT and SOUTX are held and output. Here, the same clock signal as the clock signal CKA of the connected comparator 12 is input to the corresponding latch circuit 13, as the clock signal CKA, and the same clock signal as the clock signal CKB of the connected comparator 12 is input thereto, as the clock signal CKB. Accordingly, in a case where the connected comparator 12 is in the evaluation period, the corresponding latch circuit 13 inverts and outputs, as the output signals SOUT and SOUTX, the input signals SIN and SINX, respectively, which serve as the respective output signals of the corresponding comparator 12. In addition, in a case where the connected comparator 12 is in the reset period, the corresponding latch circuit 13 outputs the held output signals SOUT and SOUTX.

In addition, in accordance with the control signal THC serving as the control signal CTL output by the corresponding logical threshold adjuster 14, the amount of current applied by each of the current sources 303, 305, 307, and 309 is controlled. By changing, in accordance with the control signal THC from the corresponding logical threshold adjuster 14 in this way, the amount of current applied by each of the current sources 303, 305, 307, and 309, a time factor is changed, and accordingly, it is possible to control logical thresholds in the respective inverters 301 and 302, in other words, the logical threshold of the corresponding latch circuit 13. Therefore, the corresponding logical threshold adjuster 14 controls the amount of current applied by each of the current sources 303, 305, 307, and 309 so as to put the logical threshold of the corresponding latch circuit 13 closer to the value of the output signal of the corresponding comparator 12 in the reset period. Accordingly, it is possible to shorten a delay time in the corresponding latch circuit 13, and it becomes possible to shorten a delay time of a path for feeding back a determination result in the decision feedback equalizer, thereby enabling high data-rate communication.

Figure 4:
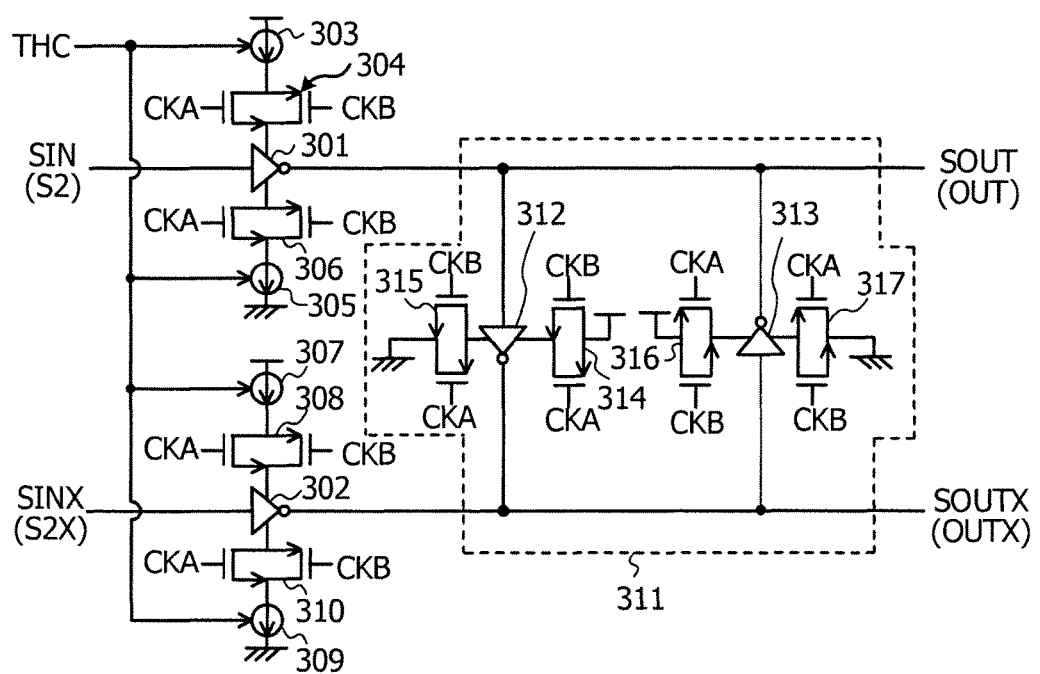
FIG. 4 is a diagram illustrating the first example of the configuration of the latch circuit in the first embodiment.
Figure 5:
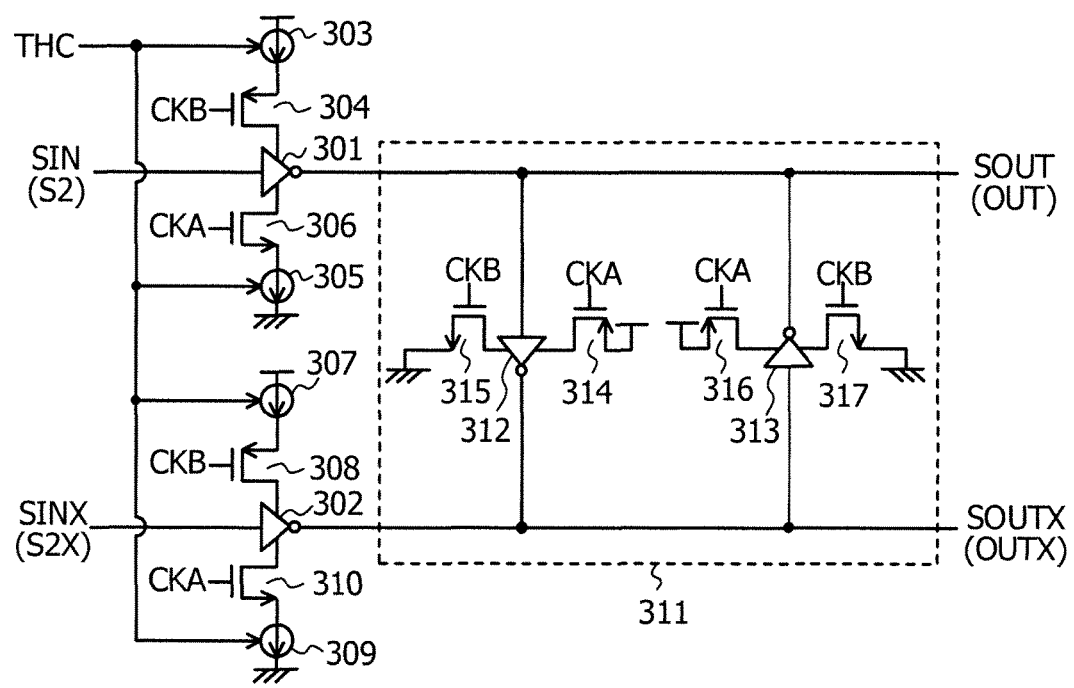
FIG. 5 is a diagram illustrating the first example of the configuration of the latch circuit in the first embodiment.

Each of the switches 304, 306, 308, 310, 314, 315, 316, and 317 in the latch circuit 13 illustrated in FIG. 3 is configured by a transistor, for example. A complementary switch configured by an N-channel transistor and a P-channel transistor may be used as illustrated in FIG. 4, for example, or a switch configured by one of an N-channel transistor and a P-channel transistor may be used as illustrated in FIG. 5. Note that, in each of FIG. 4 and FIG. 5, the same symbol is assigned to a configuration element having the same function as that of a configuration element illustrated in FIG. 3.

Figure 19:
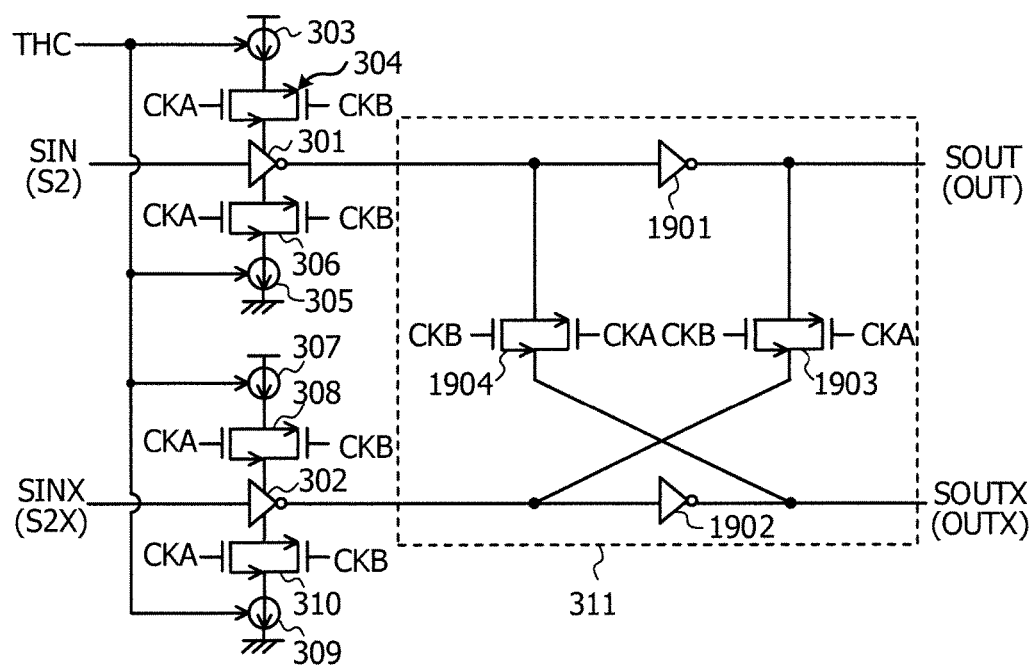
FIG. 19 is a diagram illustrating the first example of the configuration of the latch circuit in the first embodiment.

In addition, the holding circuit 311 is not limited to the above-described configuration and may adopt such a configuration as illustrated in, for example, FIG. 19. The holding circuit 311 illustrated in FIG. 19 includes inverters 1901 and 1902 and switches 1903 and 1904. An input of the inverter 1901 is connected to an output of the inverter 301, and an output thereof is connected to a signal line of the output signal SOUTX. An input of the inverter 1902 is connected to an output of the inverter 302, and an output thereof is connected to a signal line of the output signal SOUT.

In addition, the output of the inverter 1901 and the input of the inverter 1902 are connected to each other via the switch 1903 controlled by the clock signal CKB, and the output of the inverter 1902 and the input of the inverter 1901 are connected to each other via the switch 1904 controlled by the clock signal CKB. The switches 1903 and 1904 are put into respective on-states (respective closed states) in a case of the high level of the clock signal CKB and are put into respective off-states (respective open states) in a case of the low level of the clock signal CKB. Accordingly, in a case where the clock signal CKB has the high level, in other words, the comparator 12 connected to the corresponding latch circuit 13 is in the reset period, the holding circuit 311 illustrated in FIG. 19 holds and outputs the output signals SOUT and SOUTX. Note that while being illustrated by using an example in which complementary switches are each configured by an N-channel transistor and a P-channel transistor in FIG. 19, the switches 1903 and 1904 are not limited to this.

Second Example of Configuration

Figure 6:
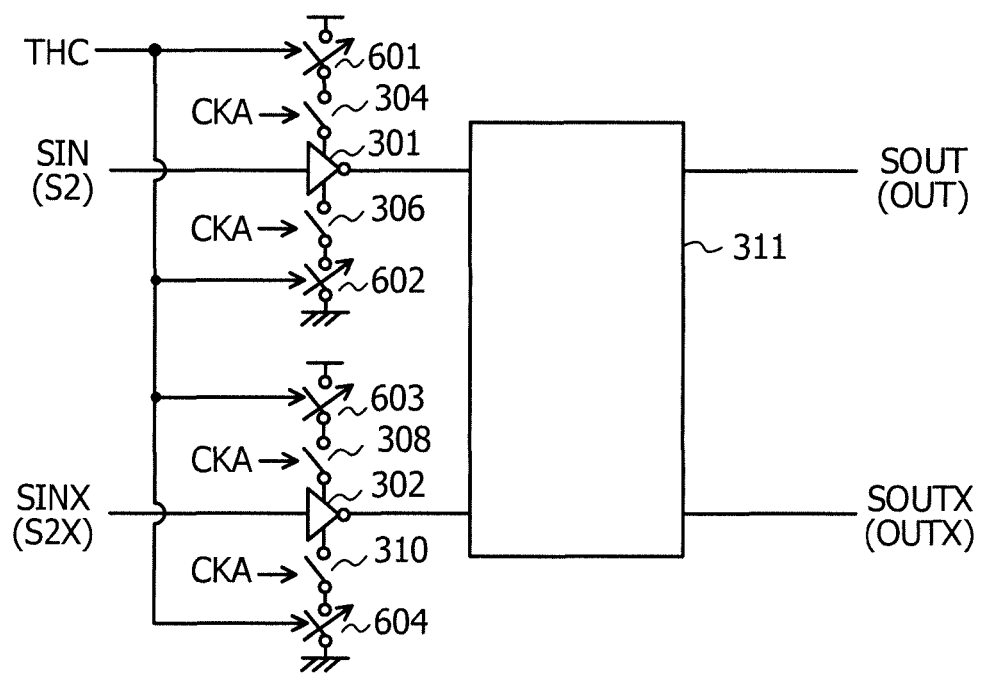
FIG. 6 is a diagram illustrating a second example of the configuration of the latch circuit in the first embodiment.

FIG. 6 is a diagram illustrating a second example of the configurations of the latch circuits 13 in the first embodiment. In FIG. 6, the same symbol is assigned to a configuration element having the same function as that of a configuration element illustrated in FIG. 3, and the redundant description thereof will be omitted.

In the latch circuit 13 illustrated in FIG. 6, the inverter 301 is connected, via the switch 304, to a switch group 601 including switches connected in parallel to the power supply potential and is connected, via the switch 306, to a switch group 602 including switches connected in parallel to the reference potential. In addition, the inverter 302 is connected, via the switch 308, to a switch group 603 including switches connected in parallel to the power supply potential and is connected, via the switch 310, to a switch group 604 including switches connected in parallel to the reference potential.

The switches included in each of the switch groups 601, 602, 603, and 604 are subjected to on-off control in accordance with the control signal THC serving as the control signal CTL output by the corresponding logical threshold adjuster 14. The number of switches to be put into respective on-states in the switch groups 601, 602, 603, and 604 is changed in accordance with the control signal THC from the corresponding logical threshold adjuster 14, thereby changing resistance components, and accordingly, it is possible to control logical thresholds in the respective inverters 301 and 302, in other words, the logical threshold of the corresponding latch circuit 13. Accordingly, the corresponding logical threshold adjuster 14 changes the number of switches to be put into respective on-states in the switch groups 601, 602, 603, and 604 and controls so as to put the logical threshold of the corresponding latch circuit 13 closer to the value of the output signal of the corresponding comparator 12 in the reset period. Accordingly, it is possible to shorten a delay time in the corresponding latch circuit 13, and it becomes possible to shorten a delay time of a path for feeding back a determination result in the decision feedback equalizer, thereby enabling high data-rate communication.

Third Example of Configuration

Figure 7:
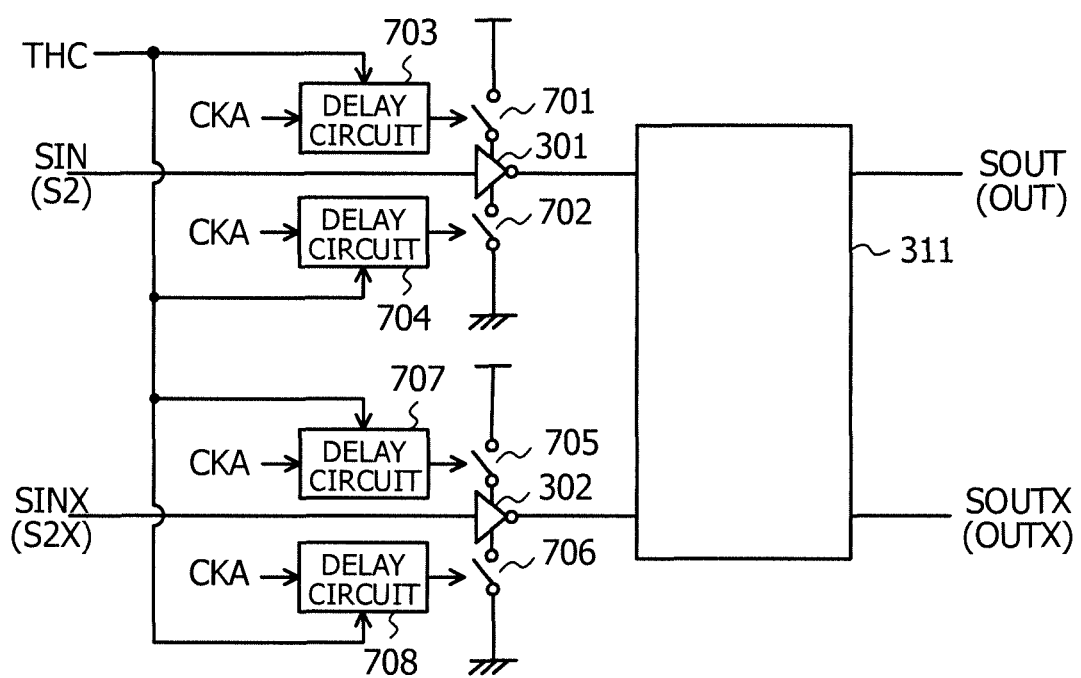
FIG. 7 is a diagram illustrating a third example of the configuration of the latch circuit in the first embodiment.

FIG. 7 is a diagram illustrating a third example of the configurations of the latch circuits 13 in the first embodiment. In FIG. 7, the same symbol is assigned to a configuration element having the same function as that of a configuration element illustrated in FIG. 3, and the redundant description thereof will be omitted.

In the latch circuit 13 illustrated in FIG. 7, the inverter 301 is connected to the power supply potential via a switch 701 and is connected to the reference potential via a switch 702.

In addition, the inverter 302 is connected to the power supply potential via a switch 705 and is connected to the reference potential via a switch 706. The switches 701, 702, 705, and 706 are controlled by the clock signals CKA delayed by delay circuits 703, 704, 707, and 708, respectively, are put into on-states (closed states) in a case of the high levels of the respective delayed clock signals CKA, and are put into off-states (open states) in a case of the low levels of the respective clock signals CKA.

A delay amount in each of the delay circuits 703, 704, 707, and 708 is controlled in accordance with the control signal THC serving as the control signal CTL output by the corresponding logical threshold adjuster 14. Delay amounts in the respective delay circuits 703, 704, 707, and 708 are changed in accordance with the control signal THC from the corresponding logical threshold adjuster 14, and different timings of being put into on-states are adopted between switches on a power supply potential side and switches on a reference potential side. Accordingly, it is possible to control logical thresholds in the respective inverters 301 and 302, in other words, the logical threshold of the latch circuit 13. Therefore, the corresponding logical threshold adjuster 14 controls the delay amounts in the respective delay circuits 703, 704, 707, and 708 and controls timings at which switches are put into respective on-states, so as to put the logical threshold of the corresponding latch circuit 13 closer to the value of the output signal of the corresponding comparator 12 in the reset period. Accordingly, it is possible to shorten a delay time in the corresponding latch circuit 13, and it becomes possible to shorten a delay time of a path for feeding back a determination result in the decision feedback equalizer, thereby enabling high data-rate communication.

Fourth Example of Configuration

Figure 8:
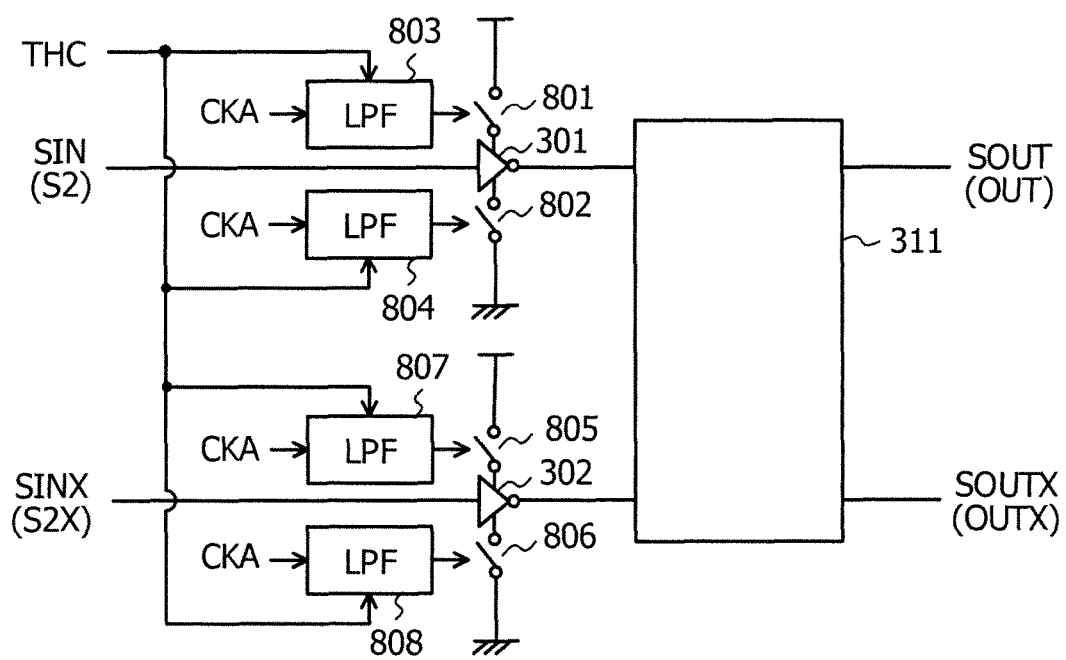
FIG. 8 is a diagram illustrating a fourth example of the configuration of the latch circuit in the first embodiment.

FIG. 8 is a diagram illustrating a fourth example of the configurations of the latch circuits 13 in the first embodiment. In FIG. 8, the same symbol is assigned to a configuration element having the same function as that of a configuration element illustrated in FIG. 3, and the redundant description thereof will be omitted.

In the latch circuit 13 illustrated in FIG. 8, the inverter 301 is connected to the power supply potential via a switch 801 and is connected to the reference potential via a switch 802. In addition, the inverter 302 is connected to the power supply potential via a switch 805 and is connected to the reference potential via a switch 806. The switches 801, 802, 805, and 806 are controlled by the clock signals CKA supplied through low-pass filters (LPFs) 803, 804, 807, and 808, respectively, are put into on-states (closed states) in a case of the respective high levels thereof, and are put into off-states (open states) in a case of the respective low levels thereof.

A time factor in each of the low-pass filters 803, 804, 807, and 808 is controlled in accordance with the control signal THC serving as the control signal CTL output by the corresponding logical threshold adjuster 14. Time factors in the respective delay circuits 803, 804, 807, and 808 are changed in accordance with the control signal THC from the corresponding logical threshold adjuster 14, and different timings of being put into on-states are adopted between switches on a power supply potential side and switches on a reference potential side. Accordingly, it is possible to control logical thresholds in the respective inverters 301 and 302, in other words, the logical threshold of the latch circuit 13. Therefore, the corresponding logical threshold adjuster 14 controls the time factors in the respective delay circuits 803, 804, 807, and 808 and controls timings at which switches are put into respective on-states, so as to put the logical threshold of the corresponding latch circuit 13 closer to the value of the output signal of the corresponding comparator 12 in the reset period. Accordingly, it is possible to shorten a delay time in the corresponding latch circuit 13, and it becomes possible to shorten a delay time of a path for feeding back a determination result in the decision feedback equalizer, thereby enabling high data-rate communication.

Fifth Example of Configuration

Figure 9:
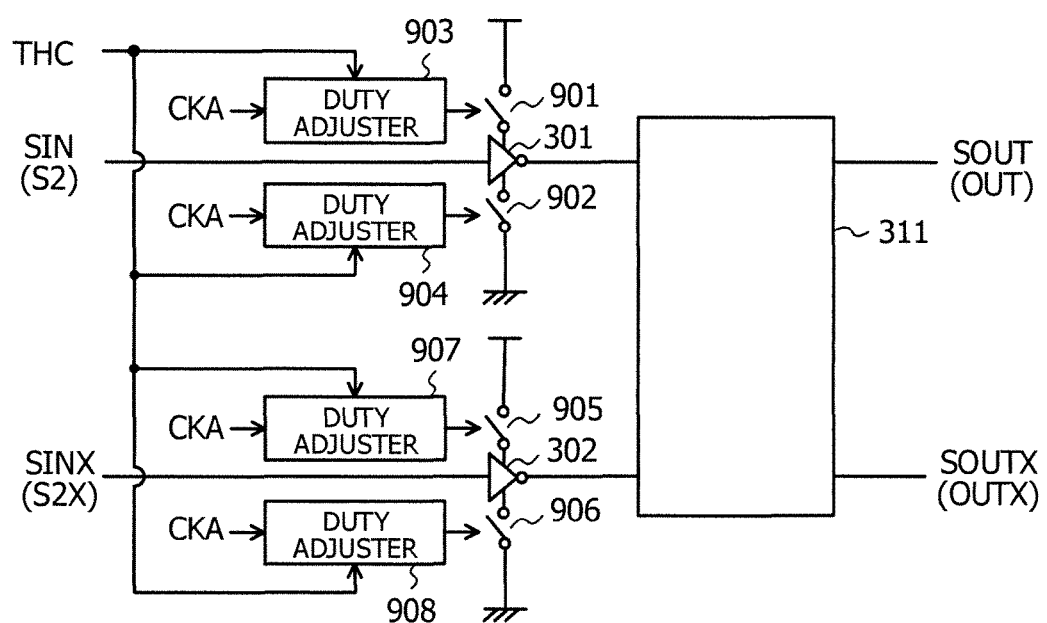
FIG. 9 is a diagram illustrating a fifth example of the configuration of the latch circuit in the first embodiment.

FIG. 9 is a diagram illustrating a fifth example of the configurations of the latch circuits 13 in the first embodiment. In FIG. 9, the same symbol is assigned to a configuration element having the same function as that of a configuration element illustrated in FIG. 3, and the redundant description thereof will be omitted.

In the latch circuit 13 illustrated in FIG. 9, the inverter 301 is connected to the power supply potential via a switch 901 and is connected to the reference potential via a switch 902. In addition, the inverter 302 is connected to the power supply potential via a switch 905 and is connected to the reference potential via a switch 906. The switches 901, 902, 905, and 906 are controlled by the clock signals CKA, duty ratios of which are controlled by duty adjusters 903, 904, 907, and 908, respectively, are put into on-states (closed states) in a case of the high levels of the respective adjusted clock signals CKA, and are put into off-states (open states) in a case of the respective low levels thereof.

The duty adjusters 903, 904, 907, and 908 are controlled by the control signal THC serving as the control signal CTL output by the corresponding logical threshold adjuster 14. The duty ratios of the clock signals CKA are changed by the respective duty adjusters 903, 904, 907, and 908 in accordance with the control signal THC from the corresponding logical threshold adjuster 14, and different timings of being put into on-states are adopted between switches on a power supply potential side and switches on a reference potential side. Accordingly, it is possible to control logical thresholds in the respective inverters 301 and 302, in other words, the logical threshold of the latch circuit 13. Therefore, the corresponding logical threshold adjuster 14 controls the duty adjusters 903, 904, 907, and 908 and controls timings at which switches are put into respective on-states, so as to put the logical threshold of the corresponding latch circuit 13 closer to the value of the output signal of the corresponding comparator 12 in the reset period. Accordingly, it is possible to shorten a delay time in the corresponding latch circuit 13, and it becomes possible to shorten a delay time of a path for feeding back a determination result in the decision feedback equalizer, thereby enabling high data-rate communication.

Sixth Example of Configuration

Figure 10:
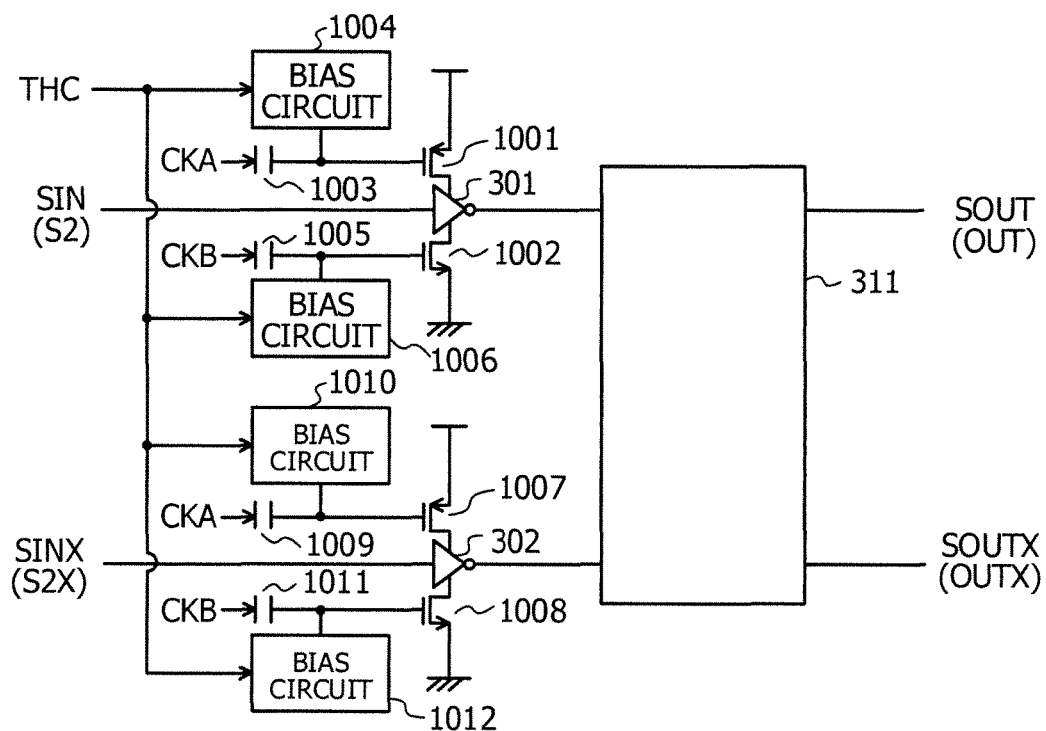
FIG. 10 is a diagram illustrating a sixth example of the configuration of the latch circuit in the first embodiment.

FIG. 10 is a diagram illustrating a sixth example of the configurations of the latch circuits 13 in the first embodiment. In FIG. 10, the same symbol is assigned to a configuration element having the same function as that of a configuration element illustrated in FIG. 3, and the redundant description thereof will be omitted.

In the latch circuit 13 illustrated in FIG. 10, the inverter 301 is connected to the power supply potential via a P-channel transistor 1001 and is connected to the reference potential via an N-channel transistor 1002. In addition, the inverter 302 is connected to the power supply potential via a P-channel transistor 1007 and is connected to the reference potential via an N-channel transistor 1008.

A gate of the transistor 1001 is controlled by the clock signal CKA the voltage level of which is changed by a DC-cut capacitor 1003 and a bias circuit 1004, and the transistor 1001 is put into an on-state (a conduction state) in a case of the high level thereof and is put into an off-state (a non-conduction state) in a case of the low level thereof. In addition, a gate of the transistor 1002 is controlled by the clock signal CKB the voltage level of which is changed by a DC-cut capacitor 1005 and a bias circuit 1006, and the transistor 1002 is put into an on-state (a conduction state) in a case of the high level thereof and is put into an off-state (a non-conduction state) in a case of the low level thereof.

In the same way, a gate of the transistor 1007 is controlled by the clock signal CKA the voltage level of which is changed by a DC-cut capacitor 1009 and a bias circuit 1010, and the transistor 1001 is put into an on-state (a conduction state) in a case of the high level thereof and is put into an off-state (a non-conduction state) in a case of the low level thereof. In addition, a gate of the transistor 1008 is controlled by the clock signal CKB the voltage level of which is changed by a DC-cut capacitor 1011 and a bias circuit 1012, and the transistor 1008 is put into an on-state (a conduction state) in a case of the high level thereof and is put into an off-state (a non-conduction state) in a case of the low level thereof.

The amount of change in a voltage level in each of the bias circuits 1004, 1006, 1010, and 1012 is controlled in accordance with the control signal THC serving as the control signal CTL output by the corresponding logical threshold adjuster 14. Voltage levels of the clock signals supplied to the gates of the respective transistors 1001, 1002, 1007, and 1008 are changed in accordance with the control signal THC from the corresponding logical threshold adjuster 14. Accordingly, it is possible to control logical thresholds in the respective inverters 301 and 302, in other words, the logical threshold of the latch circuit 13. Therefore, the corresponding logical threshold adjuster 14 controls the amounts of change in the voltage levels, caused by the respective bias circuits 1004, 1006, 1010, and 1012, and controls so as to put the logical threshold of the corresponding latch circuit 13 closer to the value of the output signal of the corresponding comparator 12 in the reset period. Accordingly, it is possible to shorten a delay time in the corresponding latch circuit 13, and it becomes possible to shorten a delay time of a path for feeding back a determination result in the decision feedback equalizer, thereby enabling high data-rate communication.

Seventh Example of Configuration

Figure 11:
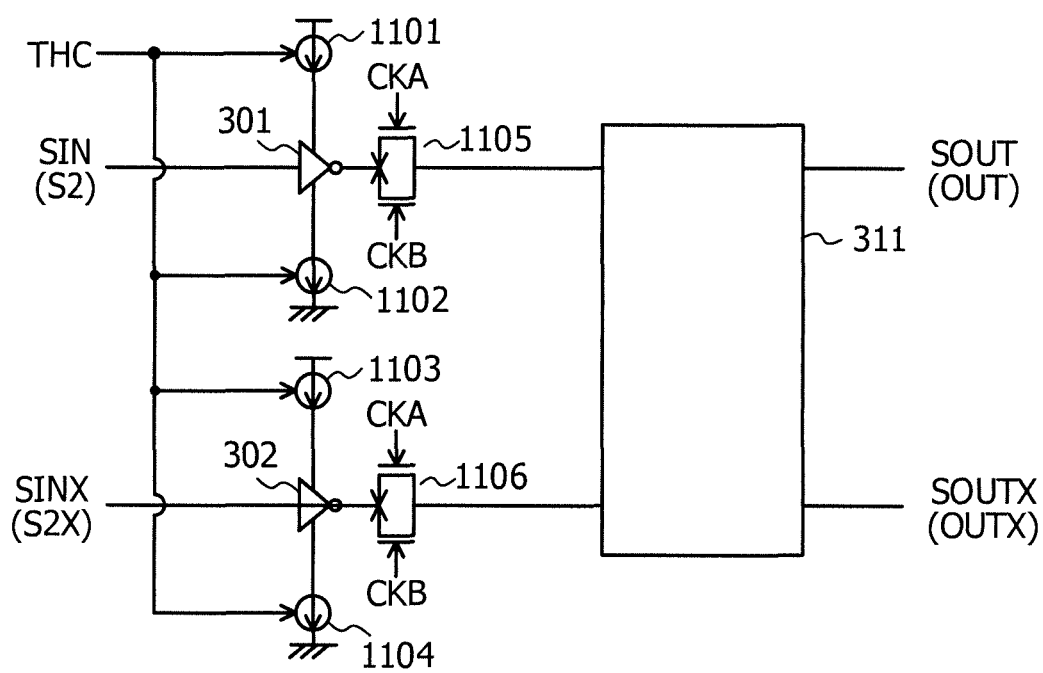
FIG. 11 is a diagram illustrating a seventh example of the configuration of the latch circuit in the first embodiment.

FIG. 11 is a diagram illustrating a seventh example of the configurations of the latch circuits 13 in the first embodiment. In FIG. 11, the same symbol is assigned to a configuration element having the same function as that of a configuration element illustrated in FIG. 3, and the redundant description thereof will be omitted.

In the latch circuit 13 illustrated in FIG. 11, the inverter 301 is connected to the power supply potential via, for example, a current source 1101 and is connected to the reference potential via a current source 1102. The output of the inverter 301 is connected to the signal line of the output signal SOUT and the holding circuit 311 via a complementary switch 1105 configured by an N-channel transistor controlled by the clock signal CKA and a P-channel transistor controlled by the clock signal CKB.

In addition, the inverter 302 is connected to the power supply potential via, for example, a current source 1103 and is connected to the reference potential via a current source 1104. The output of the inverter 302 is connected to the signal line of the output signal SOUTX and the holding circuit 311 via a complementary switch 1106 configured by an N-channel transistor controlled by the clock signal CKA and a P-channel transistor controlled by the clock signal CKB.

Note that the same method as that of one of the above-mentioned first to sixth examples of a configuration only has to be arbitrarily applied to control of a logical threshold in the corresponding latch circuit 13. In addition, while an example in which complementary switches are each configured by an N-channel transistor and a P-channel transistor is illustrated in FIG. 11, switches each configured by one of an N-channel transistor controlled by the clock signal CKA and a P-channel transistor controlled by the clock signal CKB may be adopted in place of the complementary switches.

Second Embodiment

Figure 12:
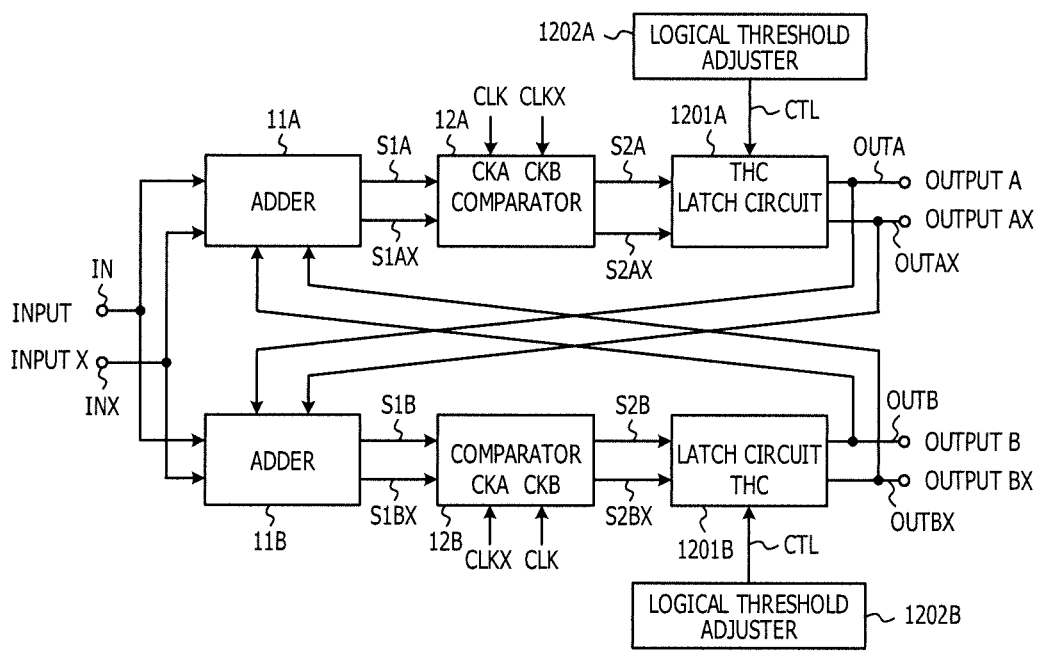
FIG. 12 is a diagram illustrating an example of a configuration of a decision feedback equalizer in a second embodiment.

Next, a second embodiment of the present technology will be described. FIG. 12 is a diagram illustrating an example of a configuration of a decision feedback equalizer (DFE) in the second embodiment. In FIG. 12, the same symbol is assigned to a configuration element having the same function as that of a configuration element illustrated in FIG. 1, and the redundant description thereof will be omitted. The decision feedback equalizer illustrated in FIG. 12 includes the adders 11A and 11B, the comparators 12A and 12B, latch circuits 1201A and 1201B, and logical threshold adjusters 1202A and 1202B.

Figure 13:
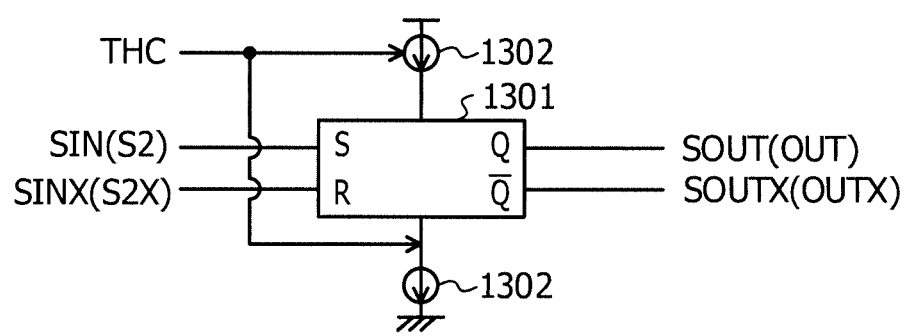
FIG. 13 is a diagram illustrating an example of a configuration of a latch circuit in the second embodiment.

The latch circuits 1201A and 1201B in the second embodiment each operate out of synchronization with a clock signal. Each of the latch circuits 1201A and 1202B is an SR latch circuit 1301 illustrated in FIG. 13, for example. In the latch circuit 13 illustrated in FIG. 13, the output signal SIN of a corresponding one of the comparators 12A and 12B is input as a set input, and the output signal SINX of the corresponding one of the comparators 12A and 12B is input as a reset input.

The SR latch circuit 1301 is connected to the power supply potential via, for example, a current source 1302 and is connected to the reference potential via a current source 1303. Note that the same method as that of one of the above-mentioned first to sixth examples of a configuration in the first embodiment only has to be arbitrarily applied to control of a logical threshold of the SR latch circuit 1301 serving as the corresponding latch circuit 13. In the same way as in the above-mentioned embodiment, logical thresholds of the respective latch circuits 1201A and 1201B are controlled so as to be put into the values of the output signals of the respective comparators 12A and 12B in the reset period. Accordingly, it is possible to shorten delay times in the respective latch circuits 1201A and 1201B, and it becomes possible to shorten delay times of paths for feeding back respective determination results in the decision feedback equalizer, thereby enabling high data-rate communication. In addition, by adopting a latch circuit out of synchronization with a clock signal as each of the latch circuits 1201A and 1201B, a wiring line of a clock signal does not have to be provided, and it is possible to reduce a circuit size.

While the above-mentioned first and second embodiments each illustrate the half-rate decision feedback equalizer (DFE) as an example, the present technology is not limited to this. The present technology may be applied to a four-parallel time-interleaved configuration, an example of which is illustrated in, for example, FIG. 14, in other words, a quarter-rate decision feedback equalizer (DFE).

Figure 14:
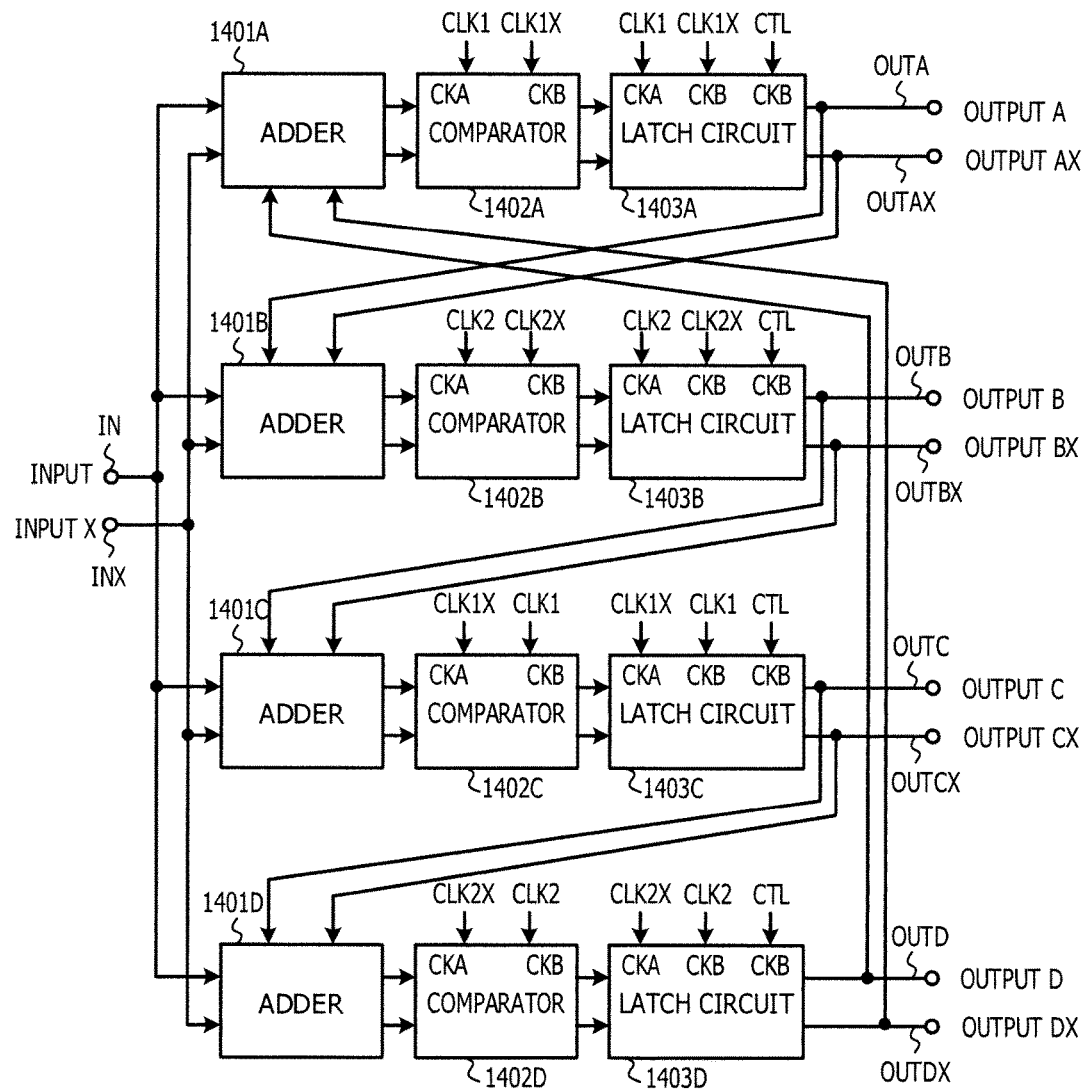
FIG. 14 is a diagram illustrating an example of the configuration of the decision feedback equalizer in the present embodiment.

FIG. 14 is a diagram illustrating another example of the configuration of the decision feedback equalizer (DFE) in the present embodiment. A quarter-rate decision feedback equalizer illustrated in FIG. 14 has a four-parallel time-interleaved configuration and includes adders 1401A, 1401B, 1401C, and 1401D, comparators 1402A, 1402B, 1402C, and 1402D, and latch circuits 1403A, 1403B, 1403C, and 1403D. Note that, in FIG. 14, illustrations of logical threshold adjusters for controlling logical thresholds of the respective latch circuits 1403A, 1403B, 1403C, and 1403D are omitted.

The adder 1401A adds, to the differential input signals IN and INX, offset voltages based on output signals OUTD and OUTDX of the latch circuit 1403D and outputs results thereof to the comparator 1402A. In addition, the adder 1401B adds, to the differential input signals IN and INX, offset voltages based on output signals OUTA and OUTAX of the latch circuit 1403A and outputs results thereof to the comparator 1402B. In the same way, the adder 1401C adds, to the differential input signals IN and INX, offset voltages based on output signals OUTB and OUTBX of the latch circuit 1403B and outputs results thereof to the comparator 1402C. In addition, the adder 1401D adds, to the differential input signals IN and INX, offset voltages based on output signals OUTC and OUTCX of the latch circuit 1403C and outputs results thereof to the comparator 1402D.

Each of the comparators 1402A, 1402B, 1402C, and 1402D is a comparator that operates in synchronization with input clock signals and that has a differential input-output configuration, and in response to the input clock signals, the comparators 1402A, 1402B, 1402C, and 1402D each perform a reset operation in the reset period and each perform a determination operation (a comparison operation) in the evaluation period. Each of the comparators 1402A, 1402B, 1402C, and 1402D is put into the reset period in a case of the low level of the clock signal CKA and is put into the evaluation period in a case of the high level of the clock signal CKA. Note that a clock signal CLK2 is a signal having a 90-degree phase difference with respect to a clock signal CLK1. In other words, clock signals CLK1, CLK2, CLK1X, and CLK2X are four-phase clock signals having 90-degree phase differences with respect to each other.

In a case where the input clock signal CLK has the low level, the comparator 1402A performs the reset operation and outputs output signals S2A and S2AX each having a low level. In addition, in a case where the clock signal CLK has the high level, the comparator 1402A performs the determination operation (the comparison operation) related to the output signals of the adder 1401A and outputs the output signals S2A and S2AX corresponding to a determination result. In a case where the input clock signal CLK has the low level, the comparator 1402B performs the reset operation and outputs output signals S2B and S2BX each having a low level. In addition, in a case where the clock signal CLK has the high level, the comparator 1402B performs the determination operation (the comparison operation) related to the output signals of the adder 1401B and outputs the output signals S2B and S2BX corresponding to a determination result.

In the same way, in a case where the input clock signal CLK has the low level, the comparator 1402C performs the reset operation and outputs output signals S2C and S2CX each having a low level. In addition, in a case where the clock signal CLK has the high level, the comparator 1402C performs the determination operation (the comparison operation) related to the output signals of the adder 1401C and outputs the output signals S2C and S2CX corresponding to a determination result. In a case where the input clock signal CLK has the low level, the comparator 1402D performs the reset operation and outputs output signals S2D and S2DX each having a low level. In addition, in a case where the clock signal CLK has the high level, the comparator 1402D performs the determination operation (the comparison operation) related to the output signals of the adder 1401D and outputs the output signals S2D and S2DX corresponding to a determination result.

The latch circuits 1403A, 1403B, 1403C, and 1403D each operate in synchronization with an input clock signal. In a case where the clock signals CKA each have the high level, the latch circuits 1403A, 1403B, 1403C, and 1403D invert and output the output signals of the corresponding comparators 1402A, 1402B, 1402C, and 1402D, respectively, and in a case where the clock signals CKA each have the low level, the latch circuits 1403A, 1403B, 1403C, and 1403D hold, invert, and output the output signals of the comparators 1402A, 1402B, 1402C, and 1402D, respectively, at a time of transitions of the clock signals CKA from the high levels to the respective low levels. In addition, in each of the latch circuits 1403A, 1403B, 1403C, and 1403D, the logical threshold for determining whether an input signal has the high level or has the low level is controlled in accordance with the control signal CTL input as the control signal THC.

In the quarter-rate decision feedback equalizer configured in this way, the logical thresholds in the respective latch circuits 1403 are controlled in the same way as in one of the above-mentioned first to sixth examples of a configuration in the first embodiment. Accordingly, it is possible to shorten delay times in the respective latch circuits 1403, and it becomes possible to shorten delay times of paths for feeding back respective determination results in the decision feedback equalizer, thereby enabling high data-rate communication. In addition, compared with a decision feedback equalizer having a half-rate configuration, it becomes possible to reduce the frequency of a clock signal.

Figure 15:
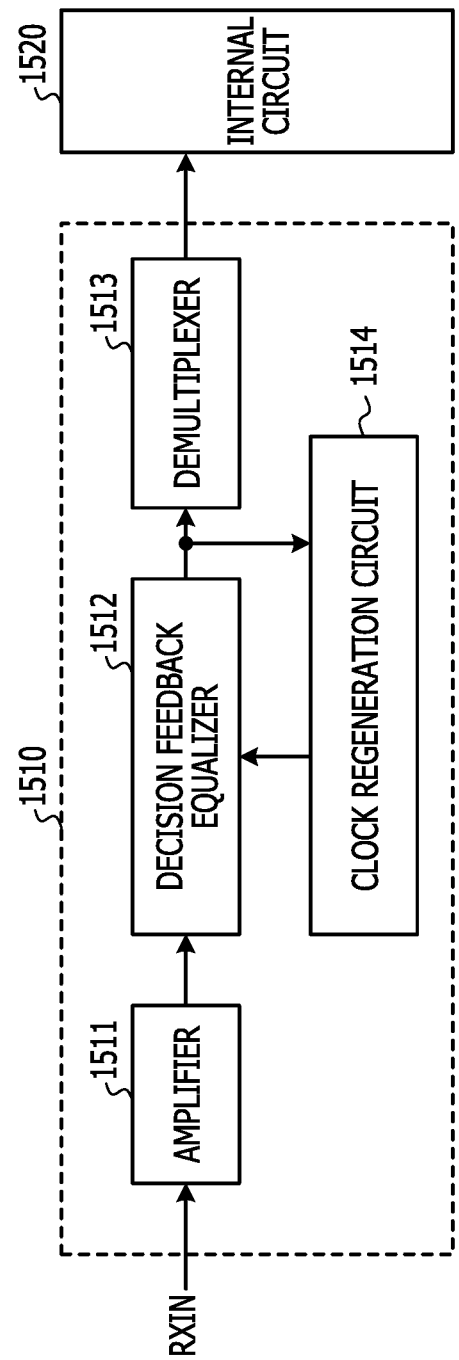
FIG. 15 is a diagram illustrating an example of a configuration of a semiconductor integrated circuit in an embodiment of the present technology.
Figure 16:
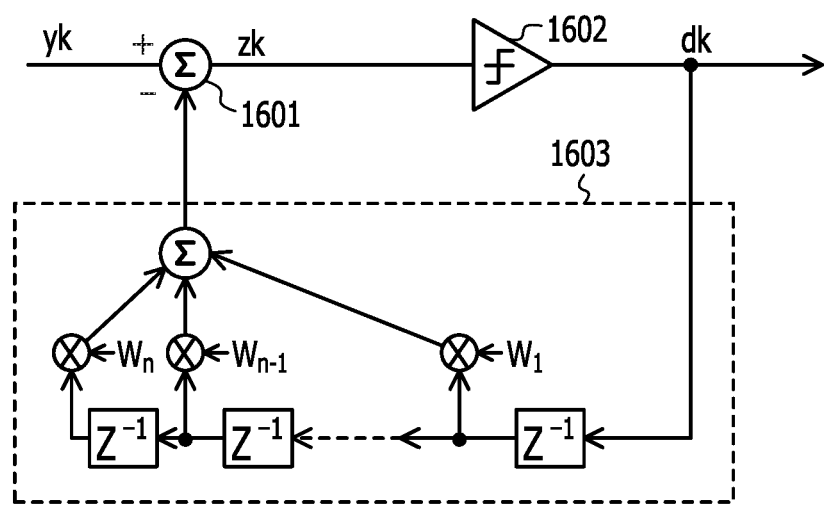
FIG. 16 is a diagram illustrating an example of a decision feedback equalizer.

FIG. 15 is a diagram illustrating an example of a configuration of a semiconductor integrated circuit including the decision feedback equalizer (DFE) in one of the above-mentioned individual embodiments. The semiconductor integrated circuit in the present embodiment includes a reception circuit 1510, which converts an input serial signal RXIN to parallel signals, and an internal circuit 1520 such as a logic circuit, which performs a processing operation upon receiving the parallel signals (data) from the reception circuit 1510.

The reception circuit 1510 includes a differential amplifier 1511, a decision feedback equalizer 1512, a demultiplexer 1513, and a clock regeneration circuit 1514. The differential amplifier 1511 receives the differential input serial signal RXIN transmitted via a communication channel or the like. The decision feedback equalizer 1512 is the decision feedback equalizer in one of the above-mentioned individual embodiments and determines the input serial signal. The demultiplexer 1513 performs serial-parallel conversion on an output of the decision feedback equalizer 1512, thereby outputting parallel data signals. The parallel data signals output by the demultiplexer 1513 are output to the internal circuit 1520. Based on a signal output by the decision feedback equalizer 1512, the clock regeneration circuit 1514 controls a phase of a clock signal supplied to the decision feedback equalizer 1512.

Note that the above-mentioned embodiments each illustrate just an example of reduction to practice in implementing the present technology, and it goes without saying that these do not allow the technical scope of the present technology to be interpreted in a limited way. In other words, the present technology may be implemented in various forms without departing from the technological thought thereof or the main characteristics thereof.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A decision feedback equalizer comprising:
   a comparator configured to output a constant voltage in a reset period and to output a differential voltage corresponding to differential input signals in an evaluation period;
   a latch circuit configured to hold the differential voltage in the evaluation period; and
   an adjuster configured to adjust a logical threshold of the latch circuit closer to the output constant voltage in the reset period.

2. The decision feedback equalizer according to claim 1, wherein
   the latch circuit includes an inverter configured to determine whether the differential voltage is a logical high level or a logical low level, and
   the adjuster adjusts the logical threshold of the latch circuit, based on the amount of current passed through the inverter.

3. The decision feedback equalizer according to claim 2, wherein the latch circuit further includes:
   a first current source connected to a power supply potential and the inverter; and
   a second current source connected to a reference potential and the inverter, wherein
   the adjuster controls the amount of current applied by each of the first current source and the second current source.

4. The decision feedback equalizer according to claim 2, wherein the latch circuit further includes:
   a first switch group including a plurality of switches connected in parallel to a power supply potential and the inverter; and
   a second switch group including a plurality of switches connected in parallel to a reference potential and the inverter, wherein
   the adjuster controls the number of switches to be put into respective on-states in the first switch group and the second switch group.

5. The decision feedback equalizer according to claim 3, wherein the latch circuit further includes:
   a first switch arranged between the power supply potential and the inverter; and
   a second switch arranged between the reference potential and the inverter, wherein
   the first switch and the second switch are put into respective off-states in the reset period and are put into respective on-states in the evaluation period.

6. The decision feedback equalizer according to claim 3, wherein the latch circuit further includes:
   a first switch arranged between the power supply potential and the inverter; and
   a second switch arranged between the reference potential and the inverter,
   wherein the adjuster adjusts the logical threshold of the latch circuit, based on timings at which the first switch and the second switch are put into respective on-states.

7. The decision feedback equalizer according to claim 6, wherein the latch circuit further includes:
a first delay circuit configured to delay a first control signal for putting the first switch into the on-state; and
a second delay circuit configured to delay a second control signal for putting the second switch into the on-state, wherein
the adjuster controls delay amounts of the first delay circuit and the second delay circuit.

8. The decision feedback equalizer according to claim 7, wherein
each of the first delay circuit and the second delay circuit is a low-pass filter, a time factor of which is controlled by the adjuster.

9. The decision feedback equalizer according to claim 6, wherein the latch circuit further includes:
a first duty adjuster configured to change a duty ratio of a first signal for controlling the first switch; and
a second duty adjuster configured to change a duty ratio of a second signal for controlling the second switch, wherein
the adjuster adjusts the duty ratios of the respective first and second signals for controlling the first switch and the second switch and controls the logical threshold of the latch circuit.

10. The decision feedback equalizer according to claim 6, wherein the latch circuit further includes:
a first bias circuit configured to change a voltage level of a first signal for controlling the first switch; and
a second bias circuit configured to change a voltage level of a second signal for controlling the second switch, wherein
the adjuster adjusts the logical threshold of the latch circuit, based on the voltage levels of the first and second signals for controlling the first switch and the second switch.

11. The decision feedback equalizer according to claim 1, wherein
the latch circuit is an SR latch circuit configured to output a high level or a low level in accordance with the output differential voltage of the comparator in the evaluation period.

12. The decision feedback equalizer according to claim 1, wherein
the decision feedback equalizer is a half-rate decision feedback equalizer in which the comparator and the latch circuit are arranged in parallel with another comparator and another latch circuit, respectively.

13. The decision feedback equalizer according to claim 1, wherein
the decision feedback equalizer is a quarter-rate decision feedback equalizer in which the comparator and the latch circuit are arranged in parallel with three other comparators and three other latch circuits, respectively.

14. A semiconductor integrated circuit comprising:
a decision feedback equalizer configured to decide data being sampled from differential input serial signals on the basis of a clock signal;
a demultiplexer configured to output a parallel signal in accordance with an output signal of the decision feedback equalizer; and
a clock recovery circuit configured to control a phase of the clock signal on the basis of a received signal, wherein the decision feedback equalizer includes:
a comparator configured to output a constant voltage in a reset period and to output a differential voltage corresponding to the differential input signals in an evaluation period,
a latch circuit configured to hold the differential voltage in the evaluation period, and
an adjuster configured to adjust a logical threshold of the latch circuit closer to the output constant voltage in the reset period.

* * * * *